US 6,717,044 B2

(12) United States Patent
Kraus, II et al.

(10) Patent No.: US 6,717,044 B2
(45) Date of Patent: Apr. 6, 2004

(54) THERMOPILE CONSTRUCTION WITH MULTIPLE EMF OUTPUTS

(76) Inventors: George William Kraus, II, 5650 Great Northern Blvd., Apt. C1, North Olmstead, OH (US) 44070; Edward Starer, 110-20 71st Ave., Forest Hills, NY (US) 11375

( * ) Notice: Subject to any disclaimer, the term of this patent is extended or adjusted under 35 U.S.C. 154(b) by 0 days.

(21) Appl. No.: 09/837,312

(22) Filed: Apr. 18, 2001

(65) Prior Publication Data

US 2002/0153036 A1 Oct. 24, 2002

(51) Int. Cl.[7] .................. H01L 35/28; H01L 35/02
(52) U.S. Cl. ............... 136/226; 136/220; 136/230
(58) Field of Search .................. 136/224, 225, 136/226, 227, 228, 230, 231, 232, 217, 220

(56) References Cited

U.S. PATENT DOCUMENTS

| | | | | |
|---|---|---|---|---|
| 2,526,112 A | * | 10/1950 | Biggle | 136/220 |
| 2,677,712 A | * | 5/1954 | Biggle | 136/221 |
| 2,820,840 A | * | 1/1958 | Cantlin | 136/201 |
| 2,987,566 A | * | 6/1961 | Ray | 136/217 |
| 3,057,941 A | * | 10/1962 | Schwartzwalder | 136/231 |
| 3,085,125 A | * | 4/1963 | Hill | 136/201 |
| 3,451,862 A | * | 6/1969 | Burgess, Jr. et al. | 136/231 |
| 3,459,598 A | * | 8/1969 | Cole et al. | 136/231 |
| 3,607,445 A | | 9/1971 | Hinos | 136/225 |
| 3,648,470 A | | 3/1972 | Schultz | 62/3 |
| 3,671,327 A | | 6/1972 | Gay | 136/225 |
| 4,092,177 A | | 5/1978 | Ray | 136/220 |
| 4,251,290 A | | 2/1981 | Gomez | 136/206 |
| 4,343,960 A | | 8/1982 | Eguchi | 136/225 |
| 5,071,258 A | | 12/1991 | Usher | 374/140 |
| 5,901,900 A | | 5/1999 | Finney | 228/173.5 |

* cited by examiner

Primary Examiner—Patrick Ryan
Assistant Examiner—Thomas H. Parsons

(57) ABSTRACT

A thermopile construction adapted for use as an electric generator capable of producing multiple EMF outputs in response to heat as from a pilot flame. A cluster of hot and cold thermocouple junctions are arrayed within a housing. The hot junction of one of the thermocouples, located at the beginning of the array, extends beyond the other hot junctions for greater sensitivity to changes in temperature as from a pilot flame and surrounding radiating surfaces. While being a part of the array, the longer thermocouple also has extension wires at the cold junction thereof to deliver the EMF of that couple alone to a control device requiring a small EMF. One such wire serves also as one of two leads for delivering the EMF of the entire array to an electromechanical device that requires a larger EMF. Additional extension wires can be added to obtain intermediate EMF values.

5 Claims, 2 Drawing Sheets

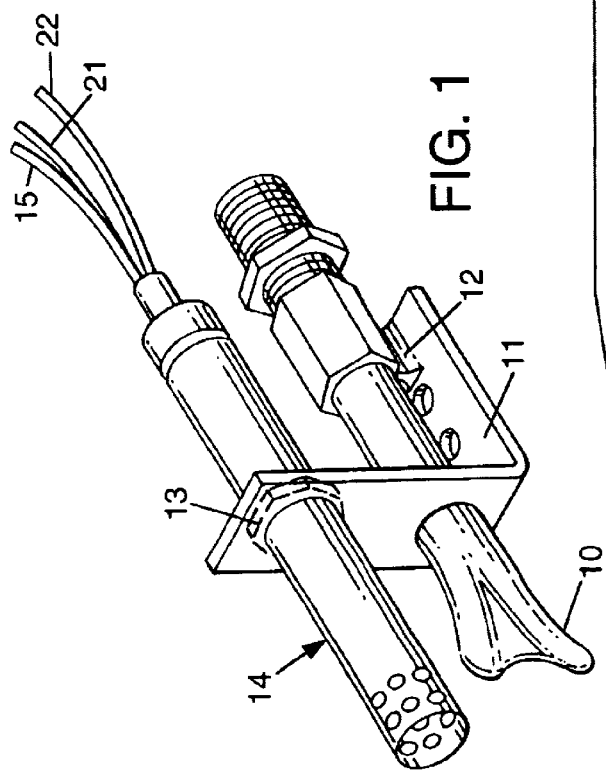
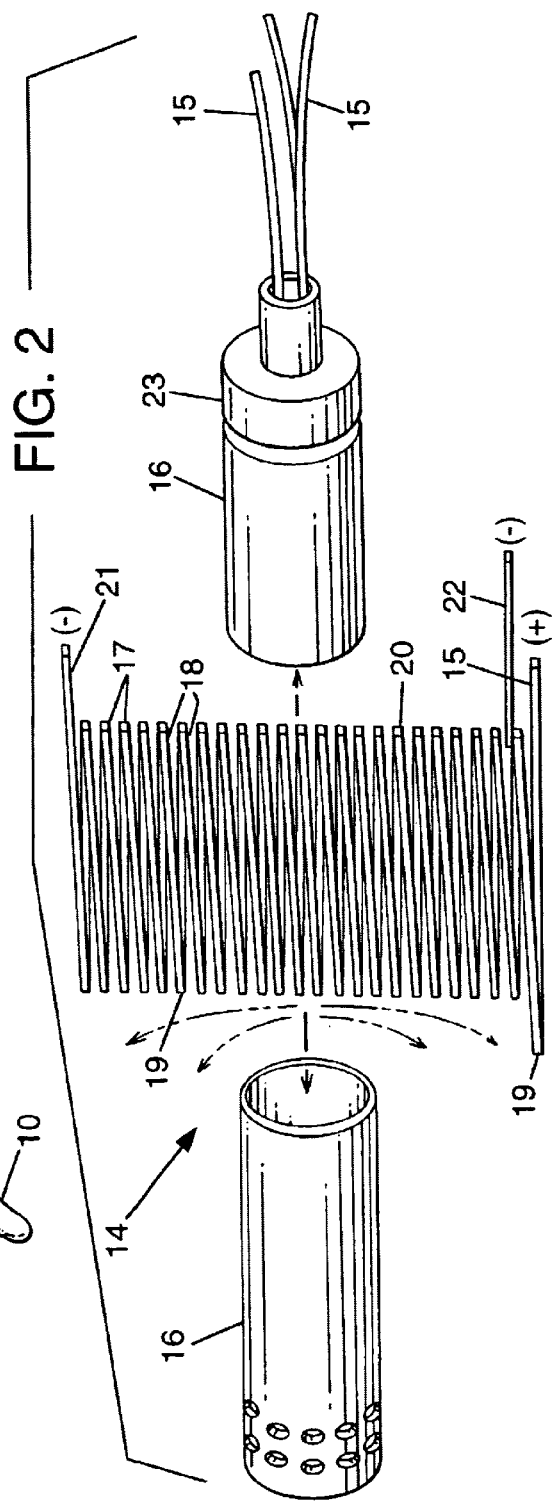

THERMOPILE CONSTRUCTION WITH MULTIPLE EMF OUTPUTS

BACKGROUND OF THE INVENTION

1. Field of the Invention

The field of the invention is primarily that of means for generating electrical current. More particularly, the invention is concerned with a form of thermopile, that is a plurality of series connected thermocouples.

Though thermopiles have a wide utility, the improved construction of this invention is particularly adapted for use as a generator for generating multiple EMF outputs in response to the presence or absence of heat from a pilot flame in gas fired or other installations. Moreover, the increased sensitivity of this thermopile allows for a faster response to activate or deactivate a valve or other device connected to it.

2. Description of Related Art

The relevant prior art is found primarily in the field of pilot generators utilized in gas-fired heating systems. A form of pilot generator embodying a thermopile has been in use for many years. This particular form consists of first and second groups of dissimilar metals arrayed in a circle and positioned against the inner side walls of a metal tube or sleeve. In a common form of the device, the elements were in the form of flat metal bands with hot and cold junctions being provided by way of welds at the ends between the flat end surfaces of the bands, the hot junctions being at one end and the cold junctions at the other. Typical dimensions of this type of construction are known in the art. In the known commercial constructions, typically there have been 12 or more thermocouples. The prior art constructions described above were subject to some drawbacks. The reduced efficiency of the prior art construction due to the mass of the sleeve and placement of the thermocouples relative to the sleeve decreased the ability of the thermopile to respond fast enough when in the presence and absence of a flame. The slower response time slowed the opening of a valve and created a potential hazard in the delayed closure of the valve in the event the pilot flame was extinguished. In addition, the device typically provided only one EMF output operating only one safety device.

SUMMARY OF INVENTION

An array of thermopile elements of dissimilar metals with one longer pair of elements of dissimilar metals is arrayed in a circular pattern within a metal sleeve or jacket to which heat from a pilot flame is applied. The thermopile elements are elongated elements, the dissimilar metals preferably being nickel chrome alloy and nickel copper alloy or iron alloy and iron constantan, the hot junctions being at one end of tile tubular array and the cold junctions at the opposite end. In the preferred embodiment, there may be 12 or more junctions. A cluster of long elements composed of two dissimilar metals are assembled with one end of one element joined with one end of a second element to form hot and cold thermocouple junctions that are arrayed in a circle. One of the groups of two dissimilar metals, being longer than the rest of the array, extends beyond the other hot junctions, thereby allowing for that hot junction greater sensitivity and responsiveness to changes in the temperature of the pilot flame and surrounding radiating surfaces. Insulation is provided in accordance with teachings well known in the art.

The primary objective of this invention is to provide an improved thermopile construction particularly of the type wherein the thermopile elements are arrayed in a circle within a tube or sleeve.

A further object of this invention is to provide an improved thermopile formed of a plurality of elongated dissimilar elements and having one longer pair of dissimilar elements extending beyond the others allowing for greater sensitivity and a faster response time to changes in the temperature of a pilot flame and surrounding radiating surfaces.

Another object of this invention is to provide an improved thermopile that is capable of providing multiple EMF outputs to operate multiple electromechanical or electronic devices.

BRIEF DESCRIPTION OF THE DRAWINGS

FIG. 1 is an isometric view of a typical pilot burner with associated pilot burner;

FIG. 2 is an exploded schematic view illustrating the thermopile elements of the herein invention;

DESCRIPTION OF THE PREFERRED EMBODIMENT

FIG. 1 shows a typical exemplary pilot burner 10 held by bracket 11. A fitting for connecting the supply tube to the burner is designated at 12. Numeral 13 designates the fastener for fixing the pilot generator 14 to bracket 11 that is the thermopile assembly. Numeral 15, 21, and 22 designate the electrical connections to the combined thermocouple and thermopile pilot generator.

Figure 3:
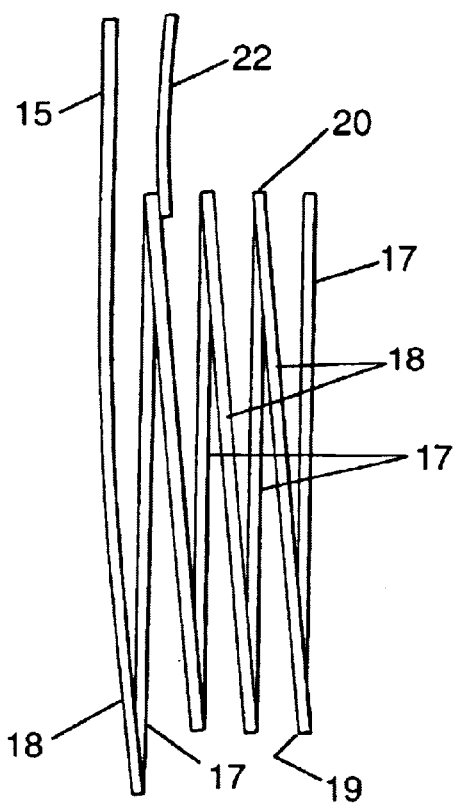
FIG. 3 is an enlarged view of a section of the thermopile elements and the junctions.
Figure 4:
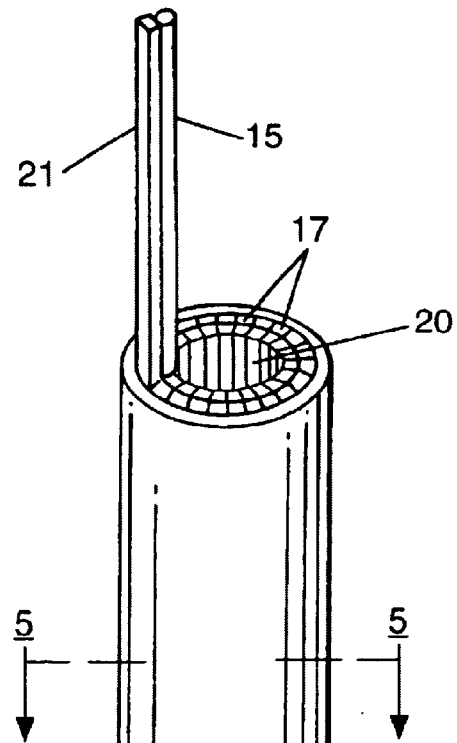
FIG. 4 is an isometric view of a preferred form of the pilot generator.

FIGS. 2 through 4 show in detail the construction of a preferred exemplary form of pilot generator of the herein invention. The thermopile elements are assembled within the sleeve or jacket 16 made of a metal having good thermal conductivity characteristics and holes around the circumference and in the area of the hot junction thermocouple. In use, the outer end of the jacket is exposed to the pilot flame, as may be seen in FIG. 1, so that the thermocouple and thermopile hot junctions are at that end with the holes, with the cold junctions at the opposite end. Heat is transferred through the holes in the sleeve to the thermocouple and an EMF is generated. Heat is also conducted along the length of the tube or jacket to the opposite end where the heat is dissipated. It is through the Peltier affect that an EMF is generated by the thermocouple and thermopile. The diameter of the jacket may be on the order of one-quarter inch or larger.

Figure 5:
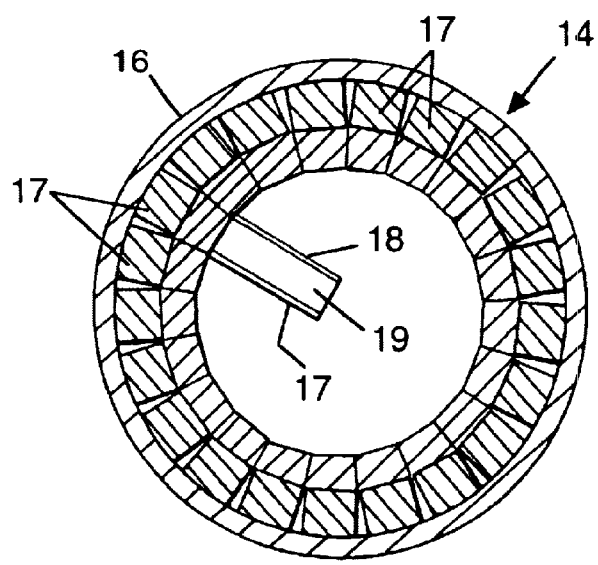
FIG. 5 is a sectional view taken along the line 5—5 of FIG. 4.

The thermopile elements consist of a first group of elements and a second group, the two groups being of dissimilar materials joined together at their ends to provide the hot and cold thermocouple junctions. The two groups of elements are arranged circularly as illustrated in FIG. 5, numeral 17 designates an individual thermopile element arranged in a circle. Numeral 18 designates an individual thermopile element of the second group, also arranged in a circle as shown in FIG. 5. The two groups of elements may be elements of nickel chrome alloy and nickel copper alloy or iron alloy or iron constantan.

FIG. 2 and 3 show the assemblies of the thermopile elements developed rather than being in circular configuration. As may be seen in FIG. 3, the element 17 is joined at one end to an element 18 forming a hot junction as designated by numeral 19. The element 17 is joined at its opposite end to the next adjacent element 18 forming a junction as designated at 20. The junctions are formed by spot welding the outer ends of the elements. The hot junctions are formed at one end and the cold junctions are formed at the opposite end. Numerals 15 and 21 designate the electrical terminal connections to the thermopile elements, the junctions being connected in series. Numeral 22 designates the electrical terminal connection to the cold junction of the thermocouple.

The configuration as described and shown is uniquely different from prior art constructions which, as previously indicated, typically utilize wires of equal length constituting a radial design with welds between surfaces adjacent to ends of the wires. With the construction as shown, the improved design utilizes a majority of wires of equal length with at least one thermocouple consisting of wires longer than the majority. The longer thermocouple decreases the response time of the devices connected to the thermopile when it is in the presence or absence of a pilot flame.

FIG. 2 illustrates how the thermopile elements are arrayed into circles as illustrated in FIG. 5 within the sleeve or jacket 16. The electrical connectors 15, 21, and 22 are held within an end fitting 23, which acts as a strain relief for the wires and cooperates with the sleeve or jacket 16.

With respect to the dimensions, it can be observed that sleeve or jacket 16, having an exemplary diameter of one-quarter inch that other relative dimensions can be observed from the drawings.

With respect to the preferred embodiment as disclosed with at least 12 thermocouples, it is capable of generating at least 450 millivolts nominal voltage, and it is capable of responding or reacting sufficiently to activate a valve within 3 seconds.

Those skilled in the art will understand the nature of the invention from the foregoing and the manner in which it achieves and realizes all of the objectives as set forth in the foregoing. As stated, the length of at least two of the elements are exemplary and not limiting. The following criteria are significant. It is desired to have good heat transfer between the jacket 16 and the thermocouple elements arrayed in a circular arrangement. It is also desired to have at least one thermocouple hot junction extending approximately one-quarter inch beyond the other thermocouples in the array that, when in the presence of a flame, will respond faster than the entire array and serve to decrease the time required to generate sufficient EMF to activate an electromechanical device such as a valve. The longer thermocouple will likewise respond within 3 seconds when the pilot flame is extinguished, thus eliminating the hazards created in allowing the device being controlled by the safety pilot to operate for a time in excess of a generally-accepted standard.

The foregoing disclosure is representative of a preferred embodiment of the invention and is to be interpreted in an illustrative rather than a limiting sense, the invention to be accorded the full scope of the claims appended hereto.

What is claimed is:

1. A thermopile having a plurality of elongated dissimilar elements of similar length and one pair of dissimilar elements of greater length, adjacent dissimilar elements of equal lengths being joined together at opposite ends to provide hot and cold thermocouple junctions, said dissimilar elements being arrayed generally in a circle around a central axis, a cylindrical sleeve with openings around the circumference of one end enclosing the elements, the dissimilar elements of equal length with one set of dissimilar elements of greater length being positioned within the cylindrical sleeve so that the dissimilar elements of greater length are positioned within the cylindrical sleeve and in communication with the openings around the circumference of the sleeve.

2. A thermopile as in claim 1, wherein the longer pair of dissimilar elements has wire leads connected to the cold junctions of each dissimilar element to provide a source of lower EMF.

3. A thermopile as in claim 1, including means holding the elements of the groups in their respective positions.

4. A thermopile as in claim 3 wherein said holding means comprises a cylindrical sleeve having the elements of the group arrayed adjacent to a surface of the sleeve.

5. A thermopile as in claim 4, wherein the elements are positioned within a cylindrical sleeve with the hot junction of the longer of the elements positioned adjacent to openings around the circumference of the sleeve.

* * * * *